(12) United States Patent
Tanaya et al.

(10) Patent No.: US 7,211,936 B2
(45) Date of Patent: May 1, 2007

(54) RESONATOR PIECE, RESONATOR, OSCILLATOR AND ELECTRONIC DEVICE

(75) Inventors: Hideo Tanaya, Suwa (JP); Fumitaka Kitamura, Suwa (JP)

(73) Assignee: Seiko Epson Corporation, Tokyo (JP)

(*) Notice: Subject to any disclaimer, the term of this patent is extended or adjusted under 35 U.S.C. 154(b) by 0 days.

(21) Appl. No.: 11/491,152

(22) Filed: Jul. 24, 2006

(65) Prior Publication Data

US 2006/0279180 A1    Dec. 14, 2006

Related U.S. Application Data

(62) Division of application No. 10/733,354, filed on Dec. 12, 2003, now Pat. No. 7,112,915.

(30) Foreign Application Priority Data

Sep. 13, 2001 (JP) .............................. 2001-278488

(51) Int. Cl.
*H03H 9/21* (2006.01)
*H01L 41/047* (2006.01)

(52) U.S. Cl. .................................... 310/370
(58) Field of Classification Search ................ 310/340, 310/348, 351, 365, 370
See application file for complete search history.

(56) References Cited

U.S. PATENT DOCUMENTS

| | | | |
|---|---|---|---|
| 6,806,797 B2 | 10/2004 | Kikushima | |
| 6,894,428 B2 | 5/2005 | Tanaya et al. | |
| 6,897,737 B2 | 5/2005 | Sakata et al. | |
| 6,898,832 B2 | 5/2005 | Kawashima | |
| 6,903,618 B2 | 6/2005 | Kawashima | |
| 6,911,765 B2 | 6/2005 | Kawashima | |
| 6,927,530 B2 | 8/2005 | Tanaya et al. | |
| 7,067,966 B2 * | 6/2006 | Tanaya | 310/367 |

FOREIGN PATENT DOCUMENTS

JP    A 2002-76827    3/2002

* cited by examiner

*Primary Examiner*—Thomas M. Dougherty
(74) *Attorney, Agent, or Firm*—Oliff and Berridge, PLC

(57) ABSTRACT

The invention provides a resonator piece, a resonator, an oscillator and an electronic device that can prevent in advance defects from arising in the electrodes and whose frequency characteristics of the resonator piece and CI value are stable. The resonator piece can include a base portion in which a base portion electrode portion is formed, resonating arm portions, groove portions including groove electrode portions, side surface electrode portions, groove electrode-use connection electrode portions, and side surface electrode-use connection electrode portions. The width of the base portion side of openings of the groove portions is formed narrower than the width of other portions, with connection electrode disposition portions for disposing the groove electrode-use connection electrode portions or the side surface electrode-use connection electrode portions being formed near the narrowly formed openings of the groove portions, and the shapes of the openings of the groove portions are formed so as to be substantially symmetrical with respect to hypothetical lines disposed along the longitudinal direction at width-direction centers of the groove portions.

15 Claims, 8 Drawing Sheets

RESONATOR PIECE, RESONATOR, OSCILLATOR AND ELECTRONIC DEVICE

This is a Division of application Ser. No. 10/733,354 filed Dec. 12, 2003 now U.S. Pat. No. 7,112,925 The disclosure of the prior application is hereby incorporated by reference herein in its entirety.

BACKGROUND OF THE INVENTION

1. Field of Invention

The present invention relates to a resonator piece comprising, for example, crystal, a resonator including the resonator piece, an oscillator disposed with the resonator, and an electronic device.

2. Description of Related Art

Conventionally, a crystal tuning fork resonator piece, which is, for example, a resonator piece, is configured as shown, for example, in FIG. 9. The crystal tuning fork resonator piece 10 includes a base portion 11 and two arm portions 12 and 13 that are formed so as to project from the base portion 11. Additionally, grooves 12a and 13a are disposed in the two arm portions 12 and 13. The grooves 12a and 13a are similarly disposed on back surfaces of the arm portions 12 and 13 that are not shown in FIG. 9.

For this reason, as shown in FIG. 10, which is a cross-sectional view along E–E' of FIG. 9, the arm portions 12 and 13 are formed so that the cross-sectional shapes thereof have substantial "H" shapes. The substantially H-shaped crystal tuning fork resonator piece 10 has the characteristic that, even if the size of the resonator piece is made significantly compact than the conventional piece, resonation loss of the arm portions 12 and 13 is kept low and the CI value (crystal impedance or equivalent series resistance) can also be kept low.

For this reason, the substantially H-shaped crystal tuning fork resonator piece 10 is particularly suited, for example, for a resonator of which compactness and high-precision performance are demanded. As this resonator, there is a compact resonator or the like whose resonance frequency is, for example, 32.768 kH, and using the substantially H-shaped crystal tuning fork resonator piece 10 as a resonator piece in this resonator is being investigated. Additionally, a compact resonator or the like whose resonance frequency is 32.768 kH will eventually be incorporated and used in precision equipment, such as watches and the like.

When a current is applied from the outside to the above mentioned substantially H-shaped crystal tuning fork resonator piece 10, the arm portions 12 and 13 resonate. Specifically, groove electrodes are formed in the grooves 12a and 13a shown in FIGS. 9 and 10, and side surface electrodes are formed in both side surfaces 12b and 13b, which are surfaces of the arm portions 12 and 13 in which the grooves 12a and 13a are not disposed. Additionally, when the current is applied, an electrical field arises between the groove electrodes and the side surface electrodes, so that the arm portions 12 and 13 resonate.

As described above, the current is applied to the groove electrodes and the side surface electrodes from the outside. Specifically, the current is supplied from the outside to the groove electrodes and the side surface electrodes via a base portion electrode disposed at the base portion 11 of the crystal tuning fork resonator piece 10.

For this reason, connection electrodes that connect the base portion electrode with the groove electrodes and the side surface electrodes become necessary. Of these connection electrodes, a groove electrode-use connection electrode that connects the base portion electrode with the groove electrodes is disposed at a base portion surface 11c in FIG. 9. Also, side surface electrode-use connection electrodes that connect the base portion electrode and the side surface electrodes are disposed, for example, at the base portion surface 11c and an arm portion surface 12c.

However, because the groove 12a and the groove electrode are formed in the arm portion surface 12c, the side surface electrode-use connection electrode disposed at the arm portion surface 12c must be disposed in a portion where the groove 12a is not formed (diagonal line portion in FIG. 9), therefore, the side surface electrode-use connection electrode is disposed in this region.

SUMMARY OF THE INVENTION

However, as described above, because the substantially H-shaped crystal tuning fork resonator piece 10 is mounted in a compact resonator or the like whose resonance frequency is, for example, 32.768 kH, compactness is particularly demanded. In accompaniment therewith, the width of the arm portions 12 and 13 in the horizontal direction in FIG. 11 is made compact, to about 0.1 mm, and the width in the horizontal direction of the grooves 12a and 13a in the horizontal direction in the drawing is made compact, to about 0.07 mm. Thus, a width W in the drawing of the region (diagonal line portion in FIG. 9) in the arm portion surface 12c disposed with the side surface electrode-use connection electrode connecting the above mentioned base portion electrode with the side surface electrodes ends up being limited to, for example, about 0.015 mm.

Incidentally, it is necessary for the width of the side surface electrode-use connection electrode disposed on the arm portion surface 12c to be, at the narrowest, about 0.01 mm. Theoretically, the space between the side surface electrode-use connection electrodes and the groove electrodes or the groove electrode-use connection electrodes is a mere 0.005 mm. There have thus been the problems that, when consideration is given to error in the actual manufacturing process, the side surface electrode-use connection electrodes and the groove electrodes or the groove electrode-use connection electrodes make contact and the potential to cause other short circuits is high, which is a cause of defects in the resonator piece.

FIG. 11 is a schematic enlarged view of the F portion of FIG. 9. In order to widen the region (diagonal line portion) in the arm portion surface 12c disposed with the side surface electrode-use connection electrode, there is also a method where the shape of the groove 12c at this portion is formed by narrowing only one side as shown, for example, in FIG. 11. However, when the shape of the groove is formed in this manner, the arm 12 is asymmetrically formed with respect to a longitudinal-direction hypothetical line C–C' of the groove 12a of the arm 12. Thus, there have been the problems that the balance of the resonating of the arm 12 collapses, the natural frequency determined by the shape changes, the CI value representing stability of the frequency of the resonator piece and vibrational energy loss increases, and fluctuations occur.

Thus, in light of the aforementioned points, it is an object of the present invention to provide a resonator piece, a resonator, an oscillator and an electronic device that can prevent in advance defects from arising in the electrodes and whose frequency characteristics and CI value of the resonator piece are stable.

According to the invention, a resonator piece is provided that includes a base portion in which a base portion electrode portion is formed, resonating arm portions formed so as to project from the base portion, groove portions including groove electrode portions formed in front surfaces and/or back surfaces of the resonating arm portions, electrode portions formed in side surfaces of the resonating arm portions in which the groove portions of the resonating arm portions are not formed, groove electrode-use connection electrode portions that connect the base portion electrode portion with the groove electrode portions, and side surface electrode-use connection electrode portions that connect the base portion electrode portion with the side surface electrode portions. The width of the base portion side of openings of the groove portions is formed narrower than the width of other portions, with connection electrode disposition portions for disposing the groove electrode-use connection electrode portions or the side surface electrode-use connection electrode portions being formed near the narrowly formed openings of the groove portions, and the shapes of the openings of the groove portions are formed so as to be substantially symmetrical with respect to hypothetical lines disposed along the longitudinal direction at width-direction centers of the groove portions.

According to the configuration, the width of the base portion side of openings of the groove portions is formed narrower than the width of other portions, with connection electrode disposition portions for disposing the groove electrode-use connection electrode portions or the side surface electrode-use connection electrode portions being formed near the narrowly formed openings of the groove portions. Thus, by disposing the groove electrode-use connection electrode portions or the side surface electrode-use connection electrode portions at the connection electrode disposition portions, the groove electrode-use connection electrode portions or the side surface electrode-use connection electrode portions can be prevented from short-circuiting with the groove electrode portions and the side surface electrode portions so that defects can be prevented in advance from occurring in the resonator piece.

Also, according to the configuration, the shapes of the openings of the groove portions can be formed so as to be substantially symmetrical with respect to hypothetical lines disposed along the longitudinal direction at width-direction centers of the groove portions. Thus, the balance of the resonating of the resonating arm portions does not collapse, the natural frequency determined by the shapes does not change, the frequency of the resonator piece is stable, there is no increase in the CI value representing vibrational energy loss, and fluctuations can be prevented in advance from occurring.

Preferably, in a resonator piece according to the invention, the resonating arm portions in the configuration are plurally formed, and the shapes of the openings of the groove portions formed in the plurality of resonating arm portions are substantially the same.

According to the above configuration, the resonating arm portions are plurally formed, and the shapes of the openings of the groove portions formed in the plurality of resonating arm portions are substantially the same. Thus, even with a resonator piece including the plurality of resonating arm portions, the groove electrode-use connection electrode portions or the side surface electrode-use connection electrode portions can be prevented from short-circuiting with the groove electrode portions and the side surface electrode portions so that defects can be prevented in advance from occurring in the resonator piece. Also, the balance of the resonating of the resonating arm portions does not collapse, the natural frequency determined by the shapes does not change, the frequency of the resonator piece is stable, there is no increase in the CI value representing vibrational energy loss, and fluctuations can be prevented in advance from occurring.

Preferably, in the resonator piece according to the invention, the width of the narrowly formed openings of the groove portions described above is formed narrower than the width of the openings of the groove portions of other portions by about 0.02 mm.

According to the above configuration, the width of the narrowly formed openings of the groove portions is formed narrower than the width of the openings of the groove portions of other portions by about 0.02 mm. Thus, because the width of the connection electrode disposition portions can be secured so that it is at least about 0.05 mm wider than the width of the other portions, the groove electrode-use connection electrode portions or the side surface electrode-use connection electrode portions can be prevented from short-circuiting with the groove electrode portions and the side surface electrode portions so that defects can be prevented in advance from occurring in the resonator piece.

Preferably, in a resonator piece according to the above invention, the groove portions in the above-described configuration are formed in the front surfaces and the back surfaces of the resonating arm portions, and in a case where cross sections of the each resonating arm portion are formed in a depth direction of the groove portions, the cross sections are formed in substantial "H" shapes.

Preferably, according to the invention, the resonator piece in the configuration described above is formed by a crystal tuning fork resonator piece.

Preferably, in a resonator piece according to the invention, the resonance frequency of the crystal tuning fork resonator piece in the configuration described above is substantially 32 kH.

According to the above configurations, the groove electrode-use connection electrode portions or the side surface electrode-use connection electrode portions of the resonator piece can be prevented from short-circuiting with the groove electrode portions and the side surface electrode portions so that defects can be prevented in advance from occurring in the resonator piece. Also, the balance of the resonating of the resonating arm portions does not collapse, the natural frequency determined by the shapes does not change, the frequency of the resonator piece is stable, there is no increase in the CI value representing vibrational energy loss, and fluctuations can be prevented in advance from occurring.

According to the above invention, the aforementioned object is also achieved by a resonator in which a resonator piece is accommodated inside a package. The resonator piece can include a base portion in which a base portion electrode portion is formed, resonating arm portions formed so as to project from the base portion, groove portions including groove electrode portions formed in front surfaces and/or back surfaces of the resonating arm portions, side surface electrode portions formed in side surfaces of the resonating arm portions in which the groove portions of the resonating arm portions are not formed, groove electrode-use connection electrode portions that connect the base portion electrode portion with the groove electrode portions, and side surface electrode-use connection electrode portions that connect the base portion electrode portion with the side surface electrodeportions. The width of the base portion side of openings of the groove portions of the resonator piece is formed narrower than the width of other portions, with connection electrode disposition portions for disposing the groove electrode-use connection electrode portions or the side surface electrode-use connection electrode portions being formed near the narrowly formed openings of the groove portions, and the shapes of the openings of the groove portions are formed so as to be substantially symmetrical with respect to hypothetical lines disposed along the longitudinal direction at width-direction centers of the groove portions.

According to the above configuration, the width of the base portion side of openings of the groove portions of the resonator piece is formed narrower than the width of other portions, with connection electrode disposition portions for disposing the groove electrode-use connection electrode portions or the side surface electrode-use connection electrode portions being formed near the narrowly formed openings of the groove portions. Thus, in the resonator piece by disposing the groove electrode-use connection electrode portions or the side surface electrode-use connection electrode portions at the connection electrode disposition portions, the groove electrode-use connection electrode portions or the side surface electrode-use connection electrode portions can be prevented from short-circuiting with the groove electrode portions and the side surface electrode portions so that defects can be prevented in advance from occurring in the resonator piece.

Also, according to the above configuration, the shapes of the openings of the groove portions of the resonator piece are formed so as to be substantially symmetrical with respect to hypothetical lines disposed along the longitudinal direction at width-direction centers of the groove portions. Thus, in the resonator piece the balance of the resonating of the resonating arm portions does not collapse, the natural frequency determined by the shapes does not change, the frequency of the resonator piece is stable, there is no increase in the CI value representing vibrational energy loss, and fluctuations can be prevented in advance from occurring.

Preferably, in the resonator according to the invention, the resonating arm portions of the resonator piece in the above configuration are plurally formed, and the shapes of the openings of the groove portions formed in the plurality of resonating arm portions are substantially the same.

In the resonator according to the above configuration, the resonating arm portions of the resonator piece are plurally formed, and the shapes of the openings of the groove portions formed in the plurality of resonating arm portions are substantially the same. Thus, even with a resonator piece including the plurality of resonating arm portions, the groove electrode-use connection electrode portions or the side surface electrode-use connection electrode portions can be prevented from short-circuiting with the groove electrode portions and the side surface electrode portions so that defects can be prevented in advance from occurring in the resonator piece. Also, the balance of the resonating of the resonating arm portions does not collapse, the natural frequency determined by the shapes does not change, the frequency of the resonator piece is stable, there is no increase in the CI value representing vibrational energy loss, and fluctuations can be prevented in advance from occurring.

Preferably, according to the invention, the width of the narrowly formed openings of the groove portions of the resonator piece in the above configuration is formed narrower than the width of the openings of the groove portions of other portions by about 0.02 mm.

According to the above-described configuration, the width of the narrowly formed openings of the groove portions of the resonator piece is formed narrower than the width of the openings of the groove portions of other portions by about 0.02 mm. Thus, in the resonator, because the width of the connection electrode disposition portions can be secured so that it is at least about 0.05 mm wider than the width of the other portions, the groove electrode-use connection electrode portions or the side surface electrode-use connection electrode portions can be prevented from short-circuiting with the groove electrode portions and the side surface electrode portions so that defects can be prevented in advance from occurring in the resonator piece.

Preferably, in the resonator according to the invention, the groove portions of the resonator piece in the above configuration are formed in the front surfaces and the back surfaces of the resonating arm portions, and in a case where cross sections of the each resonating arm portion are formed in a depth direction of the groove portions, the cross sections are formed in substantial "H" shapes.

Preferably, in the resonator according to the invention, the resonator piece described above is formed by a crystal tuning fork resonator piece.

Preferably, in the resonator according to the invention, the resonance frequency of the crystal tuning fork resonator piece in the above configuration is substantially 32 kH.

Preferably, in the resonator according to the invention, the package in the above configuration is formed in a box shape.

Preferably, in the resonator according to the invention, the package in the above configuration is formed in a generally cylindrical shape.

In the resonator according to the above configurations, the groove electrode-use connection electrode portions or the side surface electrode-use connection electrode portions of the resonator piece can be prevented from short-circuiting with the groove electrode portions and the side surface electrode portions so that defects can be prevented in advance from occurring in the resonator piece. Also, the balance of the resonating of the resonating arm portions does not collapse, the natural frequency determined by the shapes does not change, the frequency of the resonator piece is stable, there is no increase in the CI value representing vibrational energy loss, and fluctuations can be prevented in advance from occurring.

According to the invention, the aforementioned object is also achieved by an oscillator in which a resonator piece and an integrated circuit are accommodated inside a package. The resonator piece can include a base portion in which a base portion electrode portion is formed, resonating arm portions formed so as to project from the base portion, groove portions including groove electrode portions formed in front surfaces and/or back surfaces of the resonating arm portions, side surface electrode portions formed in side surfaces of the resonating arm portions in which the groove portions of the resonating arm portions are not formed, groove electrode-use connection electrode portions that connect the base portion electrode portion with the groove electrode portions, and side surface electrode-use connection electrode portions that connect the base portion electrode portion with the side surface electrode portions. The width of the base portion side of openings of the groove portions of the resonator piece is formed narrower than the width of other portions, with connection electrode disposition portions for disposing the groove electrode-use connection electrode portions or the side surface electrode-use connection electrode portions being formed near the narrowly formed openings of the groove portions, and the shapes of the openings of the groove portions are formed so as to be substantially symmetrical with respect to hypothetical lines disposed along the longitudinal direction at width-direction centers of the groove portions.

According to the invention, the aforementioned object is also achieved by an electronic device used to connect a resonator, in which a resonator piece is accommodated inside a package, to a control unit. The resonator piece can include a base portion in which a base portion electrode portion is formed, resonating arm portions formed so as to project from the base portion, groove portions including groove electrode portions formed in front surfaces and/or back surfaces of the resonating arm portions, side surface electrode portions formed in side surfaces of the resonating arm portions in which the groove portions of the resonating arm portions are not formed, groove electrode-use connection electrode portions that connect the base portion electrode portion with the groove electrode portions, and side surface electrode-use connection electrode portions that connect the base portion electrode portion with the side surface electrode portions. The width of the base portion side of openings of the groove portions of the resonator piece is formed narrower than the width of other portions, with connection electrode disposition portions for disposing the groove electrode-use connection electrode portions or the side surface electrode-use connection electrode portions being formed near the narrowly formed openings of the groove portions, and the shapes of the openings of the groove portions are formed so as to be substantially symmetrical with respect to hypothetical lines disposed along the longitudinal direction at width-direction centers of the groove portions.

According to the above-described configurations, the width of the base portion side of openings of the groove portions of the resonator piece is formed narrower than the width of other portions, with connection electrode disposition portions for disposing the groove electrode-use connection electrode portions or the side surface electrode-use connection electrode portions being formed near the narrowly formed openings of the groove portions. Thus, by disposing the groove electrode-use connection electrode portions or the side surface electrode-use connection electrode portions at the connection electrode disposition portions, the groove electrode-use connection electrode portions or the side surface electrode-use connection electrode portions can be prevented from short-circuiting with the groove electrode portions and the side surface electrode portions so that defects can be prevented in advance from occurring in the resonator piece.

Also, according to the above configurations, the shapes of the openings of the groove portions of the resonator piece are formed so as to be substantially symmetrical with respect to hypothetical lines disposed along the longitudinal direction at width-direction centers of the groove portions. Thus, the balance of the resonating of the resonating arm portions does not collapse, the natural frequency determined by the shapes does not change, the frequency of the resonator piece is stable, there is no increase in the CI value representing vibrational energy loss, and fluctuations can be prevented in advance from occurring.

BRIEF DESCRIPTION OF THE DRAWINGS

The invention will be described with reference to the accompanying drawings, wherein like numerals reference like elements, and wherein.

DETAILED DESCRIPTION OF PREFERRED EMBODIMENTS

Preferable embodiments of the invention will be described in detail below on the basis of the attached drawings. It should be noted that the embodiments described below are merely preferable specific examples of the invention to which various technically preferable limitations have been added, but the scope of the invention is not limited to these embodiments.

Figure 1:
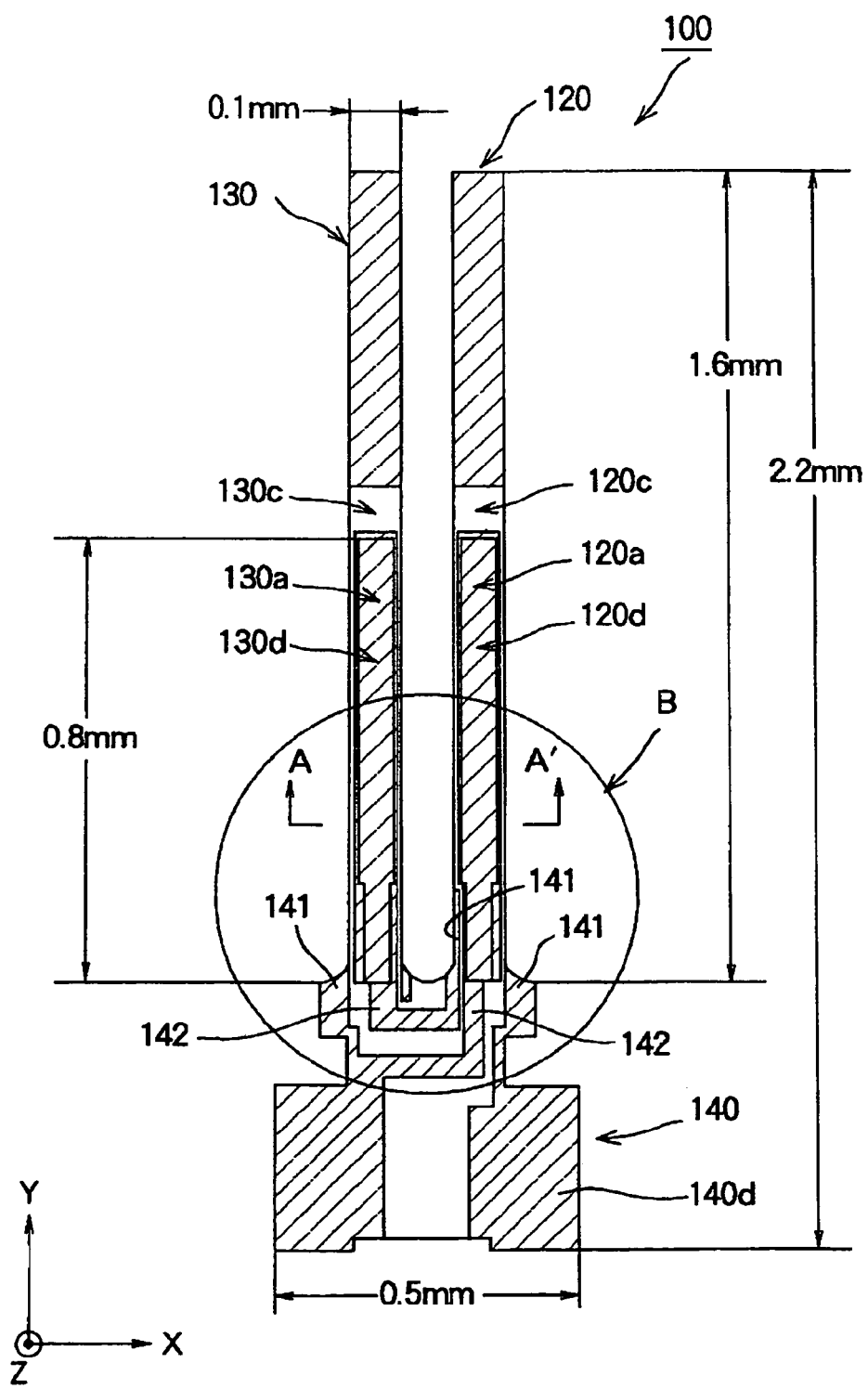
FIG. 1 is a schematic diagram showing a crystal tuning fork resonator piece that is a resonator piece according to a first embodiment of the invention.

FIG. 1 is a schematic diagram showing a substantially H-shaped crystal tuning fork resonator piece 100 that is a resonator piece according to a first embodiment of the invention. The substantially H-shaped crystal tuning fork resonator 100 is formed by being cut out from, for example, a monocrystal of crystal and processed into a tuning fork. In this case, the piece is cut out from a monocrystal of crystal so that the X axis shown in FIG. 1 is the electrical axis, the Y axis is the mechanical axis and the Z axis is the optical axis. Because the electrical axis is disposed in the X-axis direction in this manner, the substantially H-shaped crystal tuning fork resonator piece 100 is suited for electronic devices, such as cellular phone devices of which high precision is demanded.

More precisely, when the crystal tuning fork resonator piece 100 is cut out from a monocrystal of crystal, the substantially H-shaped crystal tuning fork resonator piece 100 is formed as a so-called crystal Z plate where an XY plane having the X axis and the Y axis is tilted about 1 degree to 5 degrees in a counter-clockwise direction around the X axis in the rectangular coordinate system comprising the X axis, the Y axis and the Z axis.

The substantially H-shaped crystal tuning fork resonator piece 100 includes a base portion 140 and two arm portions 120 and 130, which are resonating arm portions, formed so as to project from the base portion 140 in the Y-axis direction in the drawing.

Figure 2:
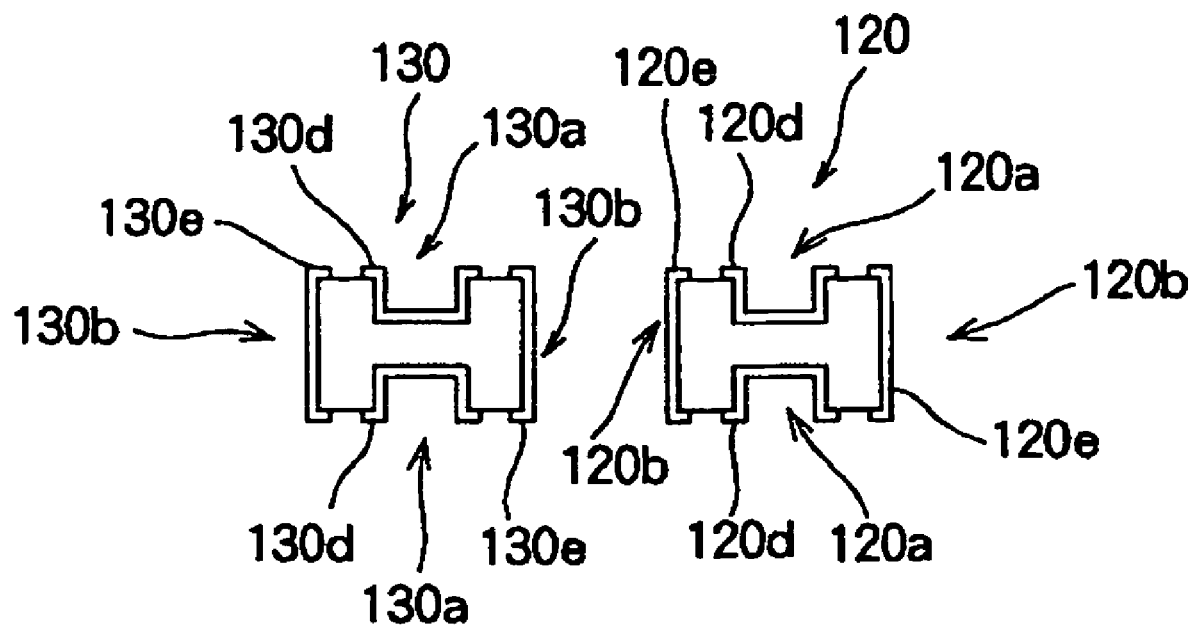
FIG. 2 shows a schematic cross-sectional view along line A–A' of FIG. 1.

As shown in FIGS. 1 and 2, groove portions 120a and 130a are respectively formed in surfaces 120c and 130c of the two arm portions 120 and 130. FIG. 2 is a schematic cross-sectional view along line A–A' of FIG. 1. The groove portions 120a and 130a are similarly formed in back surfaces of the two arm portions 120 and 130, as shown in FIG. 2. Thus, because the groove portions 120a or the like are disposed in the arm portions 120 and 130, as shown in FIG. 2, in the vertical direction in the drawing, the cross-sectional shapes thereof are formed in substantial "H" shapes. Further, because the cross-sectional shapes are substantially H-shaped, the piece is called the substantially H-shaped crystal tuning fork resonator piece 100.

As shown in FIG. 1, electrodes (diagonal line portions in the drawing) are formed on the substantially H-shaped crystal tuning fork resonator piece 100. That is, as shown in FIG. 1, a base portion electrode 140d is formed at the base portion 140, and groove electrodes 120d and 130d are respectively formed in the groove portions 120a and 130a of the arm portions 120 and 130. Also, side surface electrodes 120e and 130e are formed at respective side surfaces 120b, 120b, 130b and 130b of both of the arm portions 120 and 130 shown in FIG. 2.

Of these side surface electrodes 120e and 130e, the side surface electrode 120e disposed at the outer side in the drawing of the arm portion 120 of FIG. 2 and the side surface electrode 130e disposed at the outer side in the drawing of the arm portion 130 are connected to the base portion electrode 140d via side surface electrode-use connection electrodes 141, as shown in FIG. 1.

Also, the side surface electrode 120e disposed at the inner side in the drawing of the arm portion 120 of FIG. 2 is connected to the side surface electrode-use connection electrode 141, and this side surface electrode-use connection electrode 141 is connected to the base portion electrode 140 at the back surface of the drawing.

As shown in FIG. 1, groove electrode-use connection electrodes 142 for connecting the groove electrodes 120d and 130d with the base portion electrode 140d are formed. The groove electrode-use connection electrodes 142 are connected to the base portion electrode 140d at the front surface and back surface of the base portion 140 of FIG. 1.

The substantially H-shaped crystal tuning fork resonator 100 has a resonance frequency of, for example, 32.768 kH and is remarkably compact in comparison to a conventional crystal tuning fork resonator of 32.768 kH. In other words, as shown in FIG. 1, the length of the substantially H-shaped crystal tuning fork resonator 100 in the Y-axis direction is, for example, about 2.2 mm, and the width of the substantially H-shaped crystal tuning fork resonator 100 in the X-axis direction is, for example, about 0.5 mm. These dimensions are remarkably small in comparison to the 3.6 mm (Y-axis direction) and 0.69 mm (X-axis direction) that are the common dimensions of a conventional crystal tuning fork resonator piece.

Also, the length of the arm portion 120 in the Y-axis direction shown in FIG. 1 is, for example, about 1.6 mm and the width of each arm portion 120 and 130 in the X-axis direction is, for example, about 0.1 mm. The size of the arm portion 120 is remarkably small in comparison to the 2.4 mm (Y-axis direction) and the 0.23 mm (X-axis direction) that are the common dimensions of conventional arm portions.

As shown in FIGS. 1 and 2, the groove portions 120a and 130a are formed in the arm portions 120 and 130 that are remarkably small in comparison to a conventional crystal tuning fork resonator piece. The groove portions 120a and 130a are formed at a length of, for example, about 0.8 mm in the Y-axis direction in the surfaces 120c and 130c of the arm portions 120 and 130.

Figure 3:
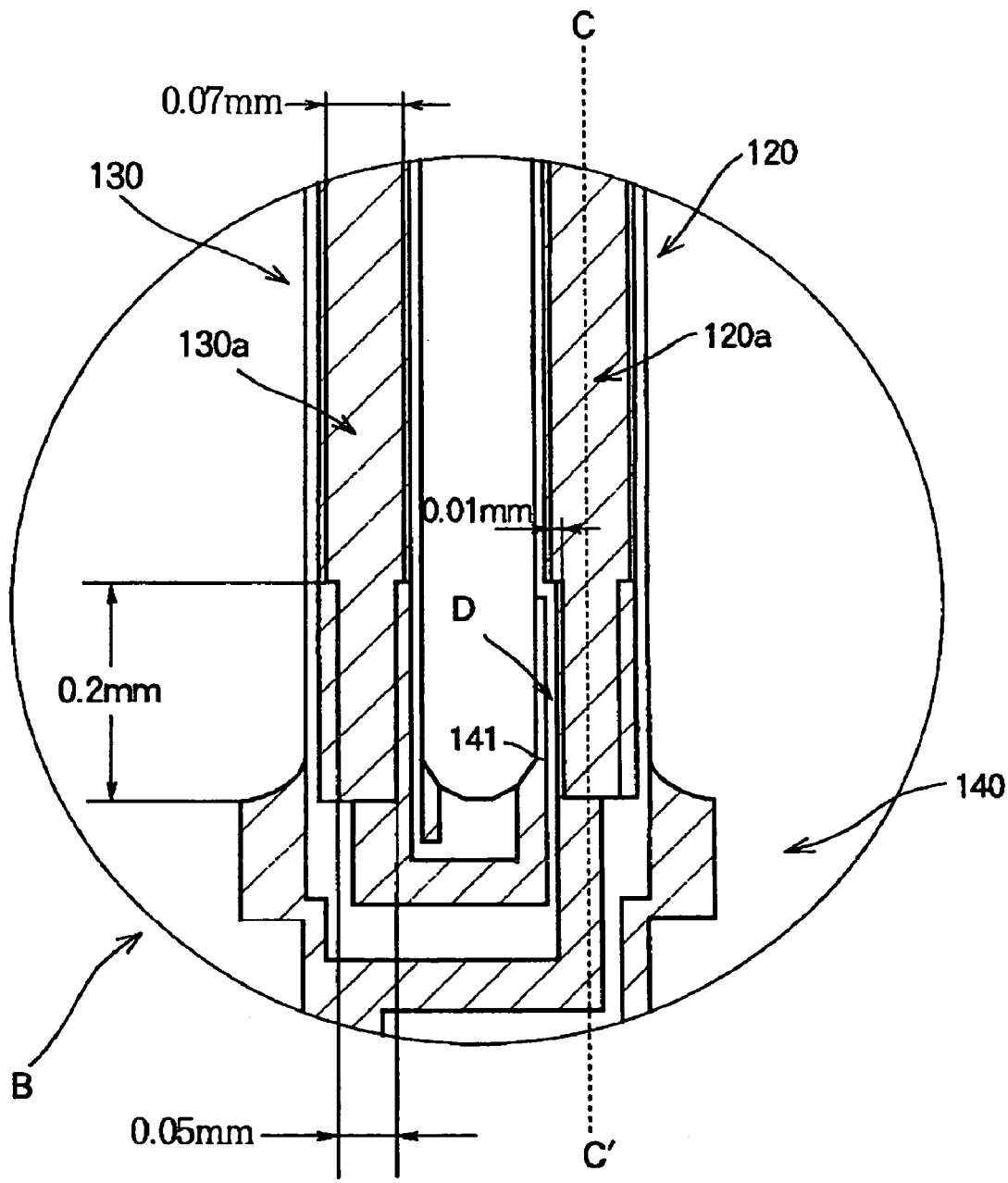
FIG. 3 shows a schematic diagram where the portion represented by B of FIG. 1 has been enlarged.

FIG. 3 is a schematic diagram where the portion represented by B of FIG. 1 has been enlarged. As shown in FIG. 3, the width of the groove portions 120a and 130a in the X-axis direction is, for example, about 0.07 mm, and the depth of the groove portions 120a and 130a in the Z-axis direction is, for example, from about 0.02 to about 0.045 mm.

Also, the base portion 140 side of openings of the groove portions 120a and 130a (e.g., the portions from bottom end portions of the groove portions 120a and 130a to 0.2 mm) are narrowly formed, as shown in FIG. 3. These are, for example, about 0.05 mm and are formed to be about 0.02 mm narrower than the aforementioned 0.07 mm. For example, the shape of the opening of the groove portion 120a is formed so as to be substantially symmetrical with respect to a hypothetical line C–C' disposed in the longitudinal direction at the width-direction center of the groove portion shown in FIG. 3. Additionally, the groove portion 130a of the other arm portion 130 is similarly formed to have this substantial symmetry.

In this manner, the portions at the base portion side of the groove portions 120a and 130a are narrowly formed. For example, as shown in FIG. 3, the narrowed portion of the base portion side of the arm portion 120 is formed narrower by 0.01 mm at the left side and by 0.01 mm at the right side.

For this reason, the groove electrodes 120a to be disposed at these narrowly formed portions can be made smaller by 0.01 mm in the width direction and disposed. A connection electrode disposition portion D is formed at the narrow left side of the groove portion 120a of the arm portion 120, and the side surface electrode-use connection electrode 141 is disposed at the connection electrode disposition portion D in order to be connected with the side surface electrode 120e at the inner side of the arm portion 120.

Conventionally, when the side surface electrode-use connection electrode 141 is disposed in a state where the groove portions 120a are not narrowly formed, the gap between the groove electrodes 120a formed in the groove portions 120a and the side surface electrode-use connection electrode 141 has been a mere 0.01 mm and dangers, such as short circuits have been great.

However, in the present embodiment, the groove portions 120a are narrowly formed with a length of 0.2 mm from the bottom end portion and with the left side being narrower by 0.01 mm. Thus, the width of the groove electrodes 120a is also narrower by 0.01 mm. Additionally, when the side surface electrode-use connection electrode 141 is disposed at the left side (inner side) of the arm portion 120, as shown in FIG. 3, the interval between the side surface electrode-use connection electrode 141 and the groove electrode 120a increases to 0.02 mm over the conventional width by 0.01 mm. Thus, the high-performance crystal tuning fork resonator piece 100, in which it is difficult for short circuiting or the like between the side surface electrode-use connection electrode 141 and the groove electrode 120a to occur, is formed.

Also, as described above, the crystal tuning fork resonator piece 100 according to the present embodiment is formed so that the shapes of the openings of the groove portions 120a and 130a of both arm portions 120 and 130 are substantially symmetrical with respect to the hypothetical lines C–C' disposed in the longitudinal direction at the width-direction centers of the groove portions shown in FIG. 3.

Figure 4B:
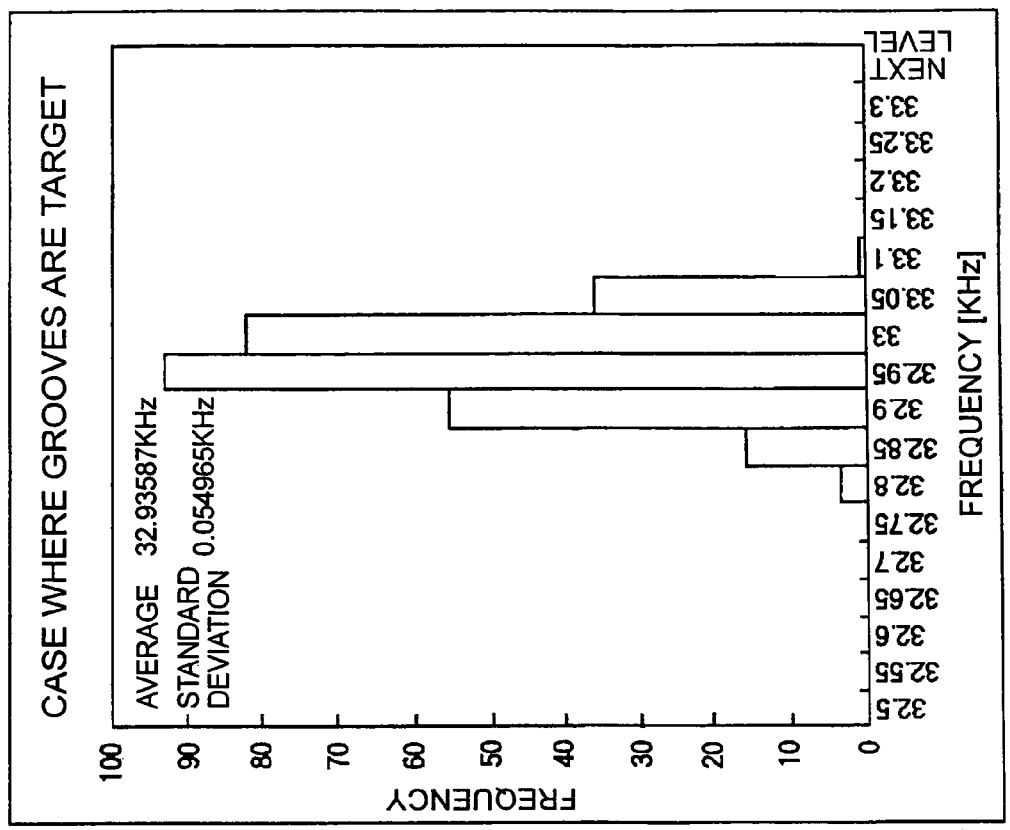
FIG. 4(b) is a graph showing the frequency average and standard deviation of the crystal tuning fork resonator piece pertaining to the present embodiment.
Figure 4A:
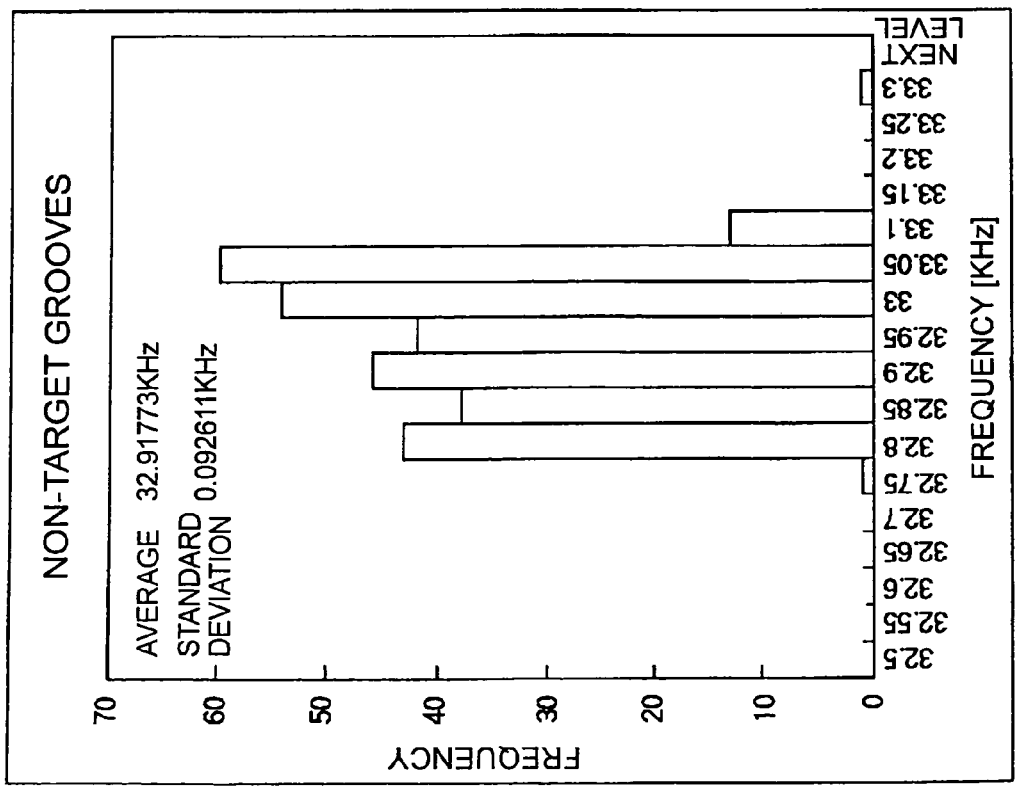
FIG. 4(a) is a graph showing the frequency average and standard deviation in a case where shapes of openings of groove portions are asymmetrical with respect to the aforementioned hypothetical line C–C''.

FIG. 4(a) is a graph showing the frequency average and standard deviation in a case where the shapes of the openings of the groove portions are asymmetrical with respect to the hypothetical lines C–C'. FIG. 4(b) is a graph showing the frequency average and standard deviation of the crystal tuning fork resonator piece 100 according to the present embodiment.

As shown in FIGS. 4(a) and 4(b), the frequency average of the crystal tuning fork resonator piece 100 according to the present embodiment is 32.93587 kHz and the standard deviation is 0.054965 kHz. The frequency average in the case where the shapes of the openings of the groove portions are asymmetrical is 32.91773 kHz and the standard deviation is 0.092611 kHz.

Thus, it should be understood that the crystal tuning fork resonator piece 100 of the present embodiment is, in comparison to the case where the shapes of the openings of the groove portions are asymmetrical, an excellent resonator piece whose frequency is stable, in which the CI value representing vibrational energy loss does not increase, and in which fluctuations resulting from the resonator piece are difficult to occur. In other words, because, by disposing the shapes of the openings of the groove portions 120a and 130a to be substantially symmetrical with respect to the hypothetical lines C–C', it becomes difficult for the balance of the resonating of the arm portions 120 and 130 to collapse, and it also becomes difficult for the natural frequency determined by the shapes to change.

Although an example was described in the present embodiment where one side of the lower end portions of the groove portions 120a was narrowed by 0.01 mm, sometimes the CI value rapidly rises when the lower end portions are made larger than this. For this reason, it is preferable to select this value in a range that can allow for a rise in the CI value and yield resulting from short circuiting between the side surface electrode-use connection electrodes 141 and the groove electrodes 120a.

Also, although an example was described in the present embodiment where the groove portions become narrow at the length of 0.2 mm from the bottom end portions of the groove portions 120a, it is best for the length of these narrowing portions to be as short as possible. Although the lower limit of shortness depends on the precision and reliability of the process, as a result of experimentation, there was little rise in the CI value and short circuiting of electrodes did not occur even with a length of 0.05 mm. Thus, it is possible to shorten the length to about 0.05 mm.

The electrodes, such as the groove electrodes 120d and the side surface electrodes 120e disposed in this manner specifically can include multiple layers, for example, two layers, with the lower layer being formed from Cr and the upper layer being formed from Au. In this case, Ni or Ti or the like may also be used instead of Cr.

There is also a case where the electrodes include one layer. In this case, an Al layer is used. In addition, an Al electrode whose surface has been anodized, or a single-layer Cr electrode having formed on the Cr layer SiO2 or the like as a protective layer, can also be used.

Moreover, the thickness of the electrode is such that the lower Cr layer is 100 Å to 900 Å and the upper Au layer is 500 Å to 1000 Å.

The crystal tuning fork resonator piece 100 according to the present embodiment is configured as described above, and the operation or the like thereof will be described below.

First, a current is supplied, from an unillustrated power source outside of the crystal tuning fork resonator piece 100, to the base portion electrode 140d of the base portion 140.

When this happens, the current is respectively supplied to the side surface electrodes 120e and the groove electrodes 120d via the side surface electrode-use connection electrodes 141 and the groove electrode-use connection electrodes 142.

In this case, because the connection electrode disposition portion represented by D in FIG. 3 is formed between the side surface electrode-use connection electrode 141 and the groove electrode 120d or the like, contact and short circuiting or the like do not occur between the side surface electrode-use connection electrode 141 and the groove electrode 120d, even if there is manufacturing error.

When the current is applied to the groove electrodes 120d and the side surface electrodes 120e in this manner, an electrical field is generated between the groove electrodes 120d and the side surface electrodes 120e, and the electrical field is deeply distributed inside the crystal, which is a piezoelectric body.

Due to the distribution of the electrical field, the arm portions 120 and 130, which are piezoelectric bodies, resonate, whereby the tuning fork resonator piece 100 resonates. In this case, the shapes of the openings of the groove portions 120a and 130a of the arm portions 120 and 130 are formed so as to be substantially symmetrical with respect to the hypothetical lines C–C'. Thus, the balance of the resonating of the arm portions 120 and 130 does not collapse and the natural frequency determined by the shapes does not change. For this reason, the frequency of the crystal tuning fork resonator piece 100 is stable, there is no increase in the CI value representing vibrational energy loss, and fluctuations can be prevented in advance from occurring.

Moreover, the oscillation frequency in this case is, for example, 32.768 kHz. Because the cross-sectional shapes of the arm portions 120 and 130 are formed in substantial "H" shapes as shown in FIG. 2, the crystal tuning fork resonator piece 100 according to the present embodiment is a resonator piece whose performance is improved despite the fact that it is remarkably compact in comparison to a conventional crystal tuning fork resonator of 32.768 kHz.

Because the shape of the above described connection electrode disposition portion D can be formed simply by narrowing the width of the groove portions 120a of the arm portion 120, it is not necessary to dispose a special configuration in the substantially H-shaped crystal tuning fork resonator piece 100, and manufacturing costs do not rise.

Figure 5:
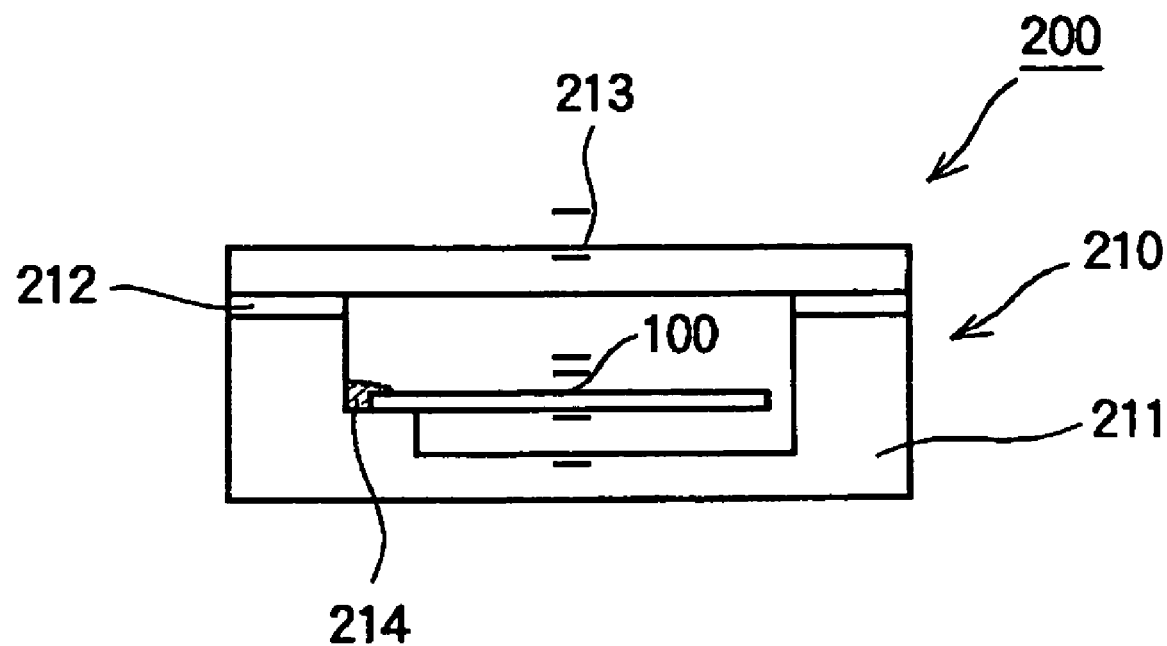
FIG. 5 shows a schematic cross-sectional view showing the configuration of a ceramic package tuning fork resonator according to a second embodiment.

FIG. 5 is a diagram showing an exemplary ceramic package tuning fork resonator 200, which is a resonator according to a second embodiment of the invention. The ceramic package tuning fork resonator 200 uses the crystal tuning fork resonator piece 100 of the first embodiment. Thus, with respect to the configuration and action or the like of the crystal tuning fork resonator piece 100, the same reference numerals will be added and description thereof will be omitted.

FIG. 5 is a schematic cross-sectional view showing the configuration of the ceramic package tuning fork resonator 200. As shown in FIG. 5, the ceramic package tuning fork resonator 200 includes a box-shaped package 210 including a space thereinside. A base portion 211 is disposed at the bottom portion of the package 210. The base portion 211 is configured by a ceramic or the like, such as alumina.

A seal portion 212 is disposed on top of the base portion 211. The seal portion 212 is formed from the same material as that of a cover portion 213. Also, the cover portion 213 is disposed on the top of the seal portion 212 so that a hollow box is formed by the base portion 211, the seal portion 212 and the cover portion 213.

A package-side electrode 214 is disposed on the base portion 211 of the package 210 formed in this manner. The base portion electrode 140*d* of the crystal tuning fork resonator piece 100 is fixed to the top of the package-side electrode 214 via a conductive adhesive or the like.

The crystal tuning fork resonator piece 100 resonates when a fixed current is applied from the package-side electrode 214. That is, as shown in FIG. 3, because the connection electrode disposition portion represented by D is formed between the side surface electrode-use connection electrode 141 and the groove electrode 120*d* in the crystal tuning fork resonator piece 100, contact and short circuiting or the like do not arise between the side surface electrode-use connection electrode 141 and the groove electrode 120*d*, even if there is manufacturing error. Thus, the ceramic package tuning fork resonator 200, which can sufficiently exhibit the performance of the substantially H-shaped crystal tuning fork resonator piece 100, is formed. Also, the ceramic package tuning fork resonator 200 can be manufactured without raising manufacturing costs.

Also, the shapes of the openings of the groove portions 120*a* and 130*a* of the arm portions 120 and 130 are formed so as to be substantially symmetrical with respect to the hypothetical lines C–C' of FIG. 3. Thus, the balance of the resonating of the arm portions 120 and 130 does not collapse and the natural frequency determined by the shapes does not change. For this reason, the resonator is one where the frequency of the crystal tuning fork resonator piece 100 is stable, there is no increase in the CI value representing vibrational energy loss, and fluctuations can be prevented in advance from occurring.

Figure 6:
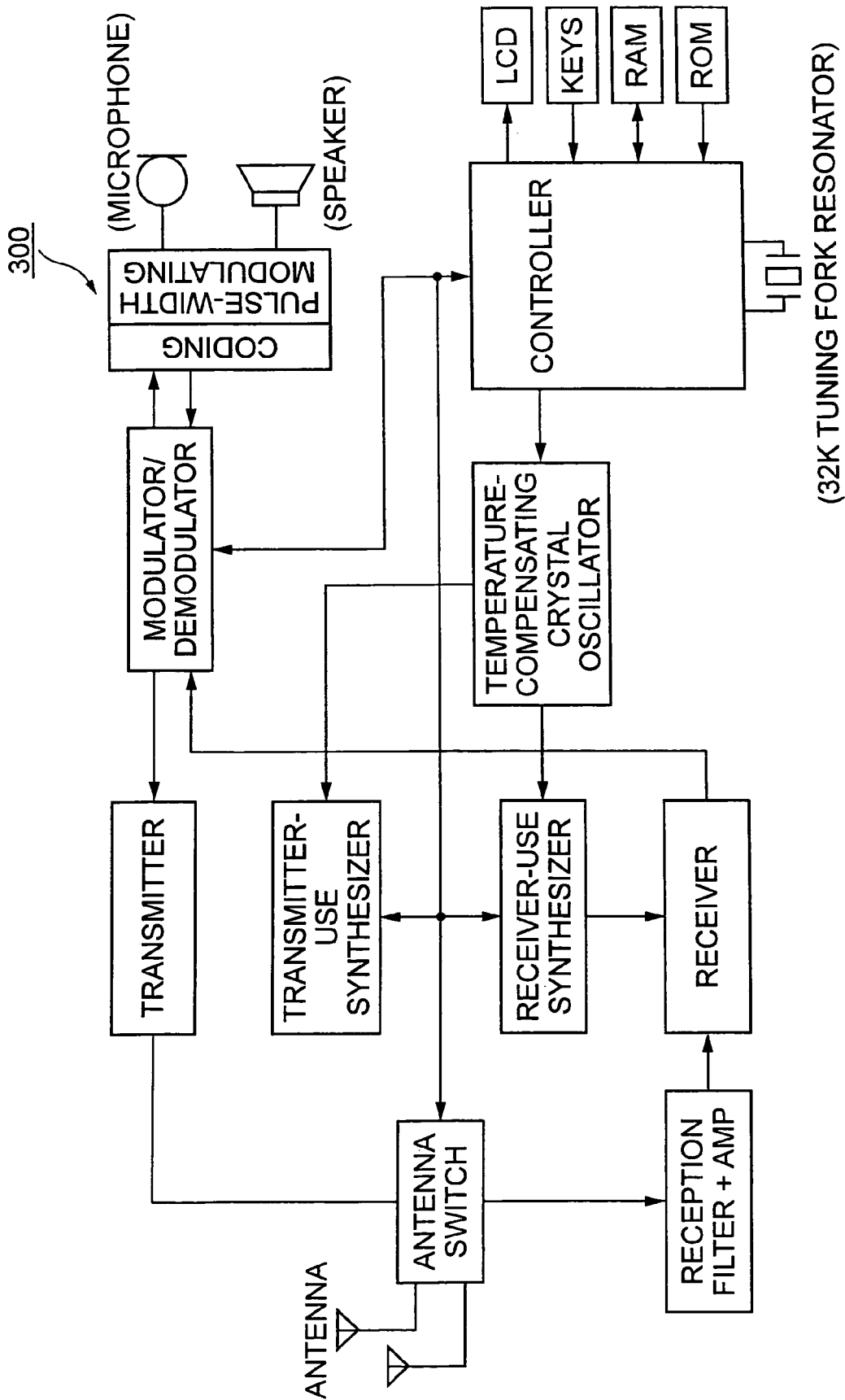
FIG. 6 shows a schematic diagram showing a circuit block of a digital cellular phone according to a third embodiment.

FIG. 6 is a diagram showing a digital cellular phone 300 that is an electronic device according to a third embodiment of the invention. The digital cellular phone 300 uses the ceramic package tuning fork resonator 200 of the preceding third embodiment and the crystal tuning fork resonator piece 100. Thus, with respect to the configuration and action of the ceramic package tuning fork resonator 200 and the substantially H-shaped crystal tuning fork resonator piece 100, the same reference numerals will be added and description thereof will be omitted.

FIG. 6 is a schematic diagram showing an exemplary circuit block of the digital cellular phone 300. As shown in FIG. 6, when a user inputs their own voice into a microphone when transmitting with the digital cellular phone 300, a signal is transmitted from an antenna via a transmitter and an antenna switch through a pulse-width modulating/coding block and a modulator/demodulator block.

A signal transmitted from another person's phone is received by the antenna and inputted from a receiver to the modulator/demodulator block through the antenna switch and a reception filter or the like. Then, the modulated or demodulated signal is outputted as a voice to a speaker through the pulse-width modulating/coding block. A controller is disposed in order to control the antenna switch and the modulator/demodulator block or the like.

Because the controller also controls, in addition to the above, an LCD that is a display unit, keys, such as an input unit for the numbers or the like, and a RAM and a ROM or the like, high precision is demanded of the controller, and the high-precision ceramic package tuning fork resonator 200 is used in order to meet this demand for a high-precision controller.

That is, as shown in FIG. 3, because the connection electrode disposition portion represented by D is formed between the side surface electrode-use connection electrode 141 and the groove electrode 120*d* or the like in the crystal tuning fork resonator piece 100 accommodated in the ceramic package tuning fork resonator 200, contact and short circuits do not arise between the side surface electrode-use connection electrode 141 and the groove electrode 120*d*, even if there is manufacturing error.

Thus, the digital cellular phone 300 that includes the ceramic package tuning fork resonator 200, which can sufficiently exhibit the performance of the crystal tuning fork resonator piece 100, is formed. Also, the digital cellular phone 300 can be manufactured without raising manufacturing costs.

Also, the shapes of the openings of the groove portions 120*a* and 130*a* of the arm portions 120 and 130 of the crystal tuning fork resonator piece 100 are formed so as to be substantially symmetrical with respect to the hypothetical line C–C' of FIG. 3. Thus, the balance of the resonating of the arm portions 120 and 130 does not collapse and the natural frequency determined by the shapes does not change. For this reason, the digital cellular phone 300 is one where the frequency of the crystal tuning fork resonator piece 100 is stable, there is no increase in the CI value representing vibrational energy loss, and fluctuations can be prevented in advance from occurring.

Figure 7:
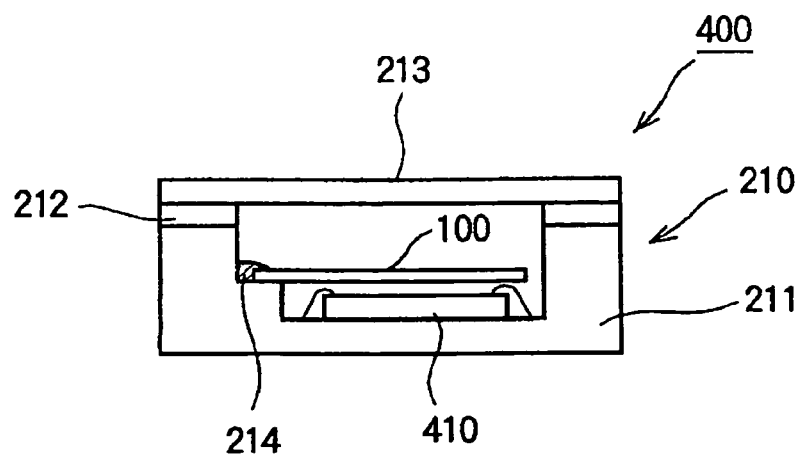
FIG. 7 shows a schematic cross-sectional view showing the configuration of a crystal tuning fork oscillator according to a fourth embodiment.

FIG. 7 is a diagram showing a crystal tuning fork oscillator 400 that is an oscillator according to a fourth embodiment of the invention. Many parts of the digital crystal tuning fork oscillator 400 shares a common configuration with that of the ceramic package tuning fork resonator 200 of the preceding third embodiment. Thus, with respect to the configuration and action or the like of the ceramic package tuning fork resonator 200 and the crystal tuning fork resonator piece 100, the same reference numerals will be added and description thereof will be omitted.

The crystal tuning fork oscillator 400 shown in FIG. 7 is one where, as shown in FIG. 7, an integrated circuit 410 is disposed on the base portion 211 below the crystal tuning fork resonator piece 100 of the ceramic package tuning fork resonator 200 shown in FIG. 5. In other words, when the crystal tuning fork resonator piece 100 disposed inside the crystal tuning fork oscillator 400 resonates, the resonation thereof is inputted to the integrated circuit 410 and a predetermined frequency signal is thereafter retrieved, whereby the crystal tuning fork oscillator 400 functions as an oscillator.

That is, as shown in FIG. 3, because the connection electrode disposition portion represented by D is formed between the side surface electrode-use connection electrode 141 and the groove electrode 120*d* or the like in the crystal tuning fork resonator piece 100 accommodated in the crystal tuning fork oscillator 400, contact and short circuits or the like do not arise between the side surface electrode-use connection electrode 141 and the groove electrode 120*d* or the like, even if there is manufacturing error. Thus, the crystal tuning fork oscillator 400, which can sufficiently exhibit the performance of the crystal tuning fork resonator piece 100, is formed. Also, the crystal tuning fork oscillator 400 can be manufactured without raising manufacturing costs.

Also, the shapes of the openings of the groove portions 120*a* and 130*a* of the arm portions 120 and 130 of the crystal tuning fork resonator piece 100 are formed so as to be substantially symmetrical with respect to the hypothetical line C–C' of FIG. 3. Thus, the balance of the resonating of the arm portions 120 and 130 does not collapse and the natural frequency determined by the shapes does not change. For this reason, the crystal tuning fork oscillator 400 is one where the frequency of the crystal tuning fork resonator piece 100 is stable, there is no increase in the CI value representing vibrational energy loss, and fluctuations can be prevented in advance from occurring.

Figure 8:
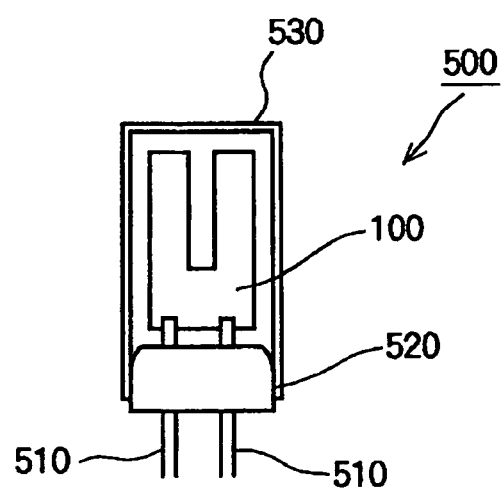
FIG. 8 shows a schematic diagram showing the configuration of a cylinder-type tuning fork resonator according to a fifth embodiment.
Figure 9:
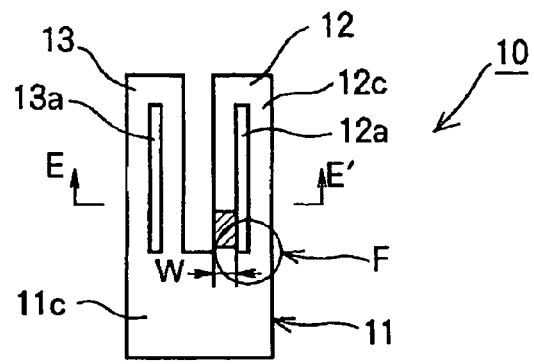
FIG. 9 shows a schematic diagram showing the configuration of a conventional crystal tuning fork resonator piece.
Figure 10:
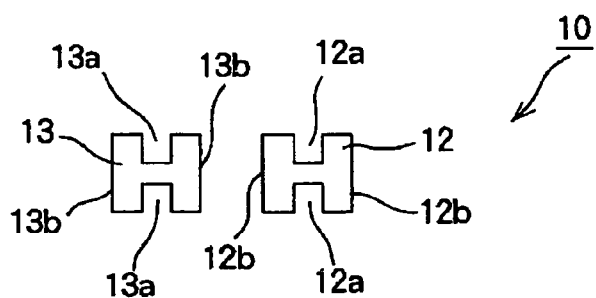
FIG. 10 shows a cross-sectional view along E–E' of FIG. 9.
Figure 11:
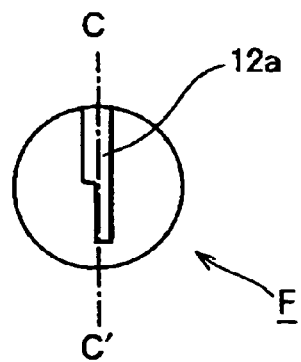
FIG. 11 shows a schematic enlarged view of an F portion of FIG. 9.

FIG. 8 is a diagram showing a generally cylindrical or cylinder-type tuning fork resonator 500 that is a resonator according to a fifth embodiment of the invention. The cylinder-type tuning fork resonator 500 uses the crystal tuning fork resonator piece 100 of the preceding first embodiment. Thus, with respect to the configuration and action or the like of the substantially H-shaped crystal tuning fork resonator piece 100, the same reference numerals will be given and description thereof will be omitted.

FIG. 8 is a schematic diagram showing the configuration of the cylinder-type tuning fork resonator 500. As shown in FIG. 8, the cylinder-type tuning fork resonator 500 includes a metal cap 530 for accommodating the crystal tuning fork resonator piece 100 thereinside. The cap 530 is press-fitted with respect to a stem 520 so that the interior is retained in a vacuum. Also, two leads 510 for retaining the crystal tuning fork resonator piece 100 accommodated in the cap 530 are disposed. When a current is applied from the outside to the cylinder-type tuning fork resonator 500, the arm portion 120 and 130 of the crystal tuning fork resonator piece 100 resonates so that the cylinder-type tuning fork resonator 500 functions as a resonator.

In this case, as shown in FIG. 3, because the connection electrode disposition portion represented by D is formed between the side surface electrode-use connection electrode 141 and the groove electrode 120d or the like in the crystal tuning fork resonator piece 100, contact and short circuits or the like do not arise between the side surface electrode-use connection electrode 141 and the groove electrode 120d or the like, even if there is manufacturing error.

Thus, the cylinder-type tuning fork resonator 500, which can sufficiently exhibit the performance of the crystal tuning fork resonator piece 100, is formed. Also, the cylinder-type tuning fork resonator 500 can be manufactured without raising manufacturing costs.

Also, the shapes of the openings of the groove portions 120a and 130a of the arm portions 120 and 130 of the crystal tuning fork resonator piece 100 are formed so as to be substantially symmetrical with respect to the hypothetical line C–C' of FIG. 3. Thus, the balance of the resonating of the arm portions 120 and 130 does not collapse and the natural frequency determined by the shapes does not change. For this reason, the cylinder-type crystal tuning fork resonator 500 is one where the frequency of the crystal tuning fork resonator piece 100 is stable, there is no increase in the CI value representing vibrational energy loss, and fluctuations can be prevented in advance from occurring.

Also, although a crystal tuning fork resonator of 32.768 kHz was described as an example in each of the preceding embodiments, it is clear that the invention can be applied to a crystal tuning fork resonator of 15 kHz to 155 kHz.

It should be noted that the crystal tuning fork resonator piece 100 according to the preceding embodiments is not limited to the preceding examples. It is clear that the crystal tuning fork resonator piece 100 can also be used in other electronic devices, personal digital assistance, televisions, video equipment, so-called radio cassette players, clocks, and devices containing clocks such as personal computers.

Moreover, the present invention is not limited to the preceding embodiments, and various alterations can be conducted in a range that does not deviate from the scope of the patent claims. Additionally, the configurations of the preceding embodiments can be changed by omitting parts thereof or optionally combining others not described.

According to the invention, a resonator piece, a resonator, an oscillator and an electronic device that can prevent in advance defects from arising in the electrodes and whose frequency characteristics and CI value are stable, and a resonator can be provided.

What is claimed:

1. A resonator piece, including:
   a base portion in which a first and a second base portion electrode portions are formed;
   a first and a second resonating arm portions formed so as to project from the base portion;
   a first groove portion including a first groove electrode portion formed in front surfaces of the first resonating arm portion;
   a second groove portion including a second groove electrode portion formed in front surfaces of the second resonating arm portion;
   a first side surface electrode portion formed in inner side surfaces of the first resonating arm portion;
   a second side surface electrode portion formed in outer side surfaces of the second resonating arm portion;
   a side surface electrode-use connection electrode portion that connects the first base portion electrode portion with the first side surface electrode portion,
   wherein a width of the base portion side of openings of the first groove portion is formed narrower than a width of other portions,
   wherein a connection electrode disposition portion for disposing the side surface electrode-use connection electrode portion is formed adjacent to narrowly formed openings of the first groove portion,
   wherein the first base portion electrode portion is connected to the second groove electrode portion, and
   wherein the second base portion electrode portion is connected to the first groove electrode portion and the second side surface electrode portion.

2. The resonator piece of claim 1, the first and second resonating arm portions being plurally formed, and the shapes of the openings of the first and second groove portions formed in the plurality of first and second resonating arm portions being substantially the same.

3. The resonator piece of claim 1, the width of the narrowly formed openings of the first groove portion being formed narrower than a width of the openings of the first groove portion of other portions by about 0.02 mm.

4. The resonator piece of claim 1, the first and second groove portions being formed in the front surfaces and back surfaces of the first and second resonating arm portions, and in a ease where cross sections of each of the first and second resonating arm portions are formed in a depth direction of the first and second groove portions, the cross sections being formed in substantial "H" shapes.

5. The resonator piece of claim 1, the resonator piece being formed by a crystal tuning fork resonator piece.

6. The resonator piece of claim 5, a resonance frequency of the crystal tuning fork resonator piece is substantially 32 kHz.

7. A resonator in which a resonator piece is accommodated inside a package, the resonator piece including:
   a base portion in which a first and a second base portion electrode portions are formed;
   a first and a second resonating arm portions formed so as to project from the base portion;
   a first groove portion including a first groove electrode portion formed in front surfaces of the first resonating arm portion;

a second groove portion including a second groove electrode portion formed in front surfaces of the second resonating arm portion;

a first side surface electrode portion formed in inner side surfaces of the first resonating arm portion;

a second side surface electrode portion formed in outer side surfaces of the second resonating arm portion;

a side surface electrode-use connection electrode portion that connects the first base portion electrode portion with the first side surface electrode portion, wherein a width of the base portion side of openings of the first groove portion of the resonator piece is formed narrower than a width of other portions, wherein a connection electrode disposition portion for disposing the side surface electrode-use connection electrode portion is formed adjacent to narrowly formed openings of the first groove portion, wherein the first base portion electrode portion is connected to the second groove electrode portion, and wherein the second base portion electrode portion is connected to the first groove electrode portion and the second side surface electrode portion.

8. The resonator of claim 7, the first and second resonating arm portions of the resonator piece being plurally formed, and the shapes of the openings of the first and second groove portions formed in the plurality of first and second resonating arm portions are substantially the same.

9. The resonator of claim 7, the width of the narrowly formed openings of the first groove portion of the resonator piece being formed narrower than a width of the openings of the first groove portion of other portions by about 0.02 mm.

10. The resonator of claim 7, the first and second groove portions of the resonator piece being formed in the front surfaces and back surfaces of the first and second resonating arm portions, and in a case where cross sections of each of the first and second resonating arm portions are formed in a depth direction of the first and second groove portions, the cross sections being formed in substantial "H" shapes.

11. The resonator of claim 7, the resonator piece being formed by a crystal tuning fork resonator piece.

12. The resonator of claim 11, the resonance frequency of the crystal tuning fork resonator piece being substantially 32 kHz.

13. The resonator of claim 7, the package being formed in a box shape.

14. The resonator of claim 8, the package being formed in a generally cylindrical shape.

15. An oscillator in which a resonator piece and an integrated circuit are accommodated inside a package, the resonator piece including:

a base portion in which a first and a second base portion electrode portions are formed;

a first and a second resonating arm portions formed so as to project from the base portion;

a first groove portion including a first groove electrode portion formed in front surfaces of the first resonating arm portion;

a second groove portion including a second groove electrode portion formed in front surfaces of the second resonating arm portion;

a first side surface electrode portion formed in inner side surfaces of the first resonating arm portion;

a second side surface electrode portion formed in outer side surfaces of the second resonating arm portion;

a side surface electrode-use connection electrode portion that connects the first base portion electrode portion with the first side surface electrode portion, wherein a width of the base portion side of openings of the first groove portion of the resonator piece is formed narrower than a width of other portions, wherein a connection electrode disposition portion for disposing the side surface electrode-use connection electrode portion is formed adjacent to narrowly formed openings of the first groove portion, wherein the first base portion electrode portion is connected to the second groove electrode portion, and wherein the second base portion electrode portion is connected to the first groove electrode portion and the second side surface electrode portion.

* * * * *